US011198917B2

(12) United States Patent
Matsuda et al.

(10) Patent No.: US 11,198,917 B2
(45) Date of Patent: Dec. 14, 2021

(54) METHOD FOR NITRIDING GRAIN-ORIENTED ELECTRICAL STEEL SHEET

(71) Applicant: JFE STEEL CORPORATION, Tokyo (JP)

(72) Inventors: Hiroshi Matsuda, Chiba (JP); Hideyuki Takahashi, Fukuyama (JP); Hiroi Yamaguchi, Kurashiki (JP); Yasuyuki Hayakawa, Asakuchi (JP); Yukihiro Shingaki, Kurashiki (JP); Takashi Terashima, Kurashiki (JP)

(73) Assignee: JFE STEEL CORPORATION, Tokyo (JP)

( * ) Notice: Subject to any disclaimer, the term of this patent is extended or adjusted under 35 U.S.C. 154(b) by 591 days.

(21) Appl. No.: 16/221,890

(22) Filed: Dec. 17, 2018

(65) Prior Publication Data

US 2019/0119773 A1 Apr. 25, 2019

Related U.S. Application Data

(62) Division of application No. 14/761,419, filed as application No. PCT/JP2014/000815 on Feb. 18, 2014, now abandoned.

(30) Foreign Application Priority Data

Feb. 18, 2013 (JP) ................... 2013-029356

(51) Int. Cl.
| | | |
|---|---|---|
| *C21D 8/12* | (2006.01) | |
| *C23C 8/26* | (2006.01) | |
| *C21D 9/00* | (2006.01) | |
| *C21D 9/46* | (2006.01) | |
| *H01F 41/02* | (2006.01) | |
| *H01J 37/32* | (2006.01) | |
| *C23C 8/38* | (2006.01) | |
| *H01F 1/16* | (2006.01) | |
| *C23C 8/02* | (2006.01) | |
| *C23C 8/80* | (2006.01) | |

(52) U.S. Cl.
CPC ............ *C21D 8/1255* (2013.01); *C21D 8/12* (2013.01); *C21D 9/0006* (2013.01); *C21D 9/46* (2013.01); *C23C 8/02* (2013.01); *C23C 8/26* (2013.01); *C23C 8/38* (2013.01); *C23C 8/80* (2013.01); *H01F 1/16* (2013.01); *H01F 41/02* (2013.01); *H01J 37/32018* (2013.01); *H01J 37/3277* (2013.01); *C21D 8/1272* (2013.01)

(58) Field of Classification Search
CPC ...... C21D 8/1255; C21D 9/46; C21D 9/0006; C21D 8/12; C21D 8/1272; C23C 8/80; C23C 8/38; C23C 8/02; C23C 8/26
See application file for complete search history.

(56) References Cited

U.S. PATENT DOCUMENTS

| | | | |
|---|---|---|---|
| 1,965,559 | A | 7/1934 | Goss |
| 3,602,190 | A | 8/1971 | Kral James, Jr. et al. |
| 3,932,234 | A | 1/1976 | Imanaka et al. |
| 4,109,157 | A | 8/1978 | Tanaka et al. |
| 4,200,805 | A | 4/1980 | Le Francois |
| 5,643,370 | A | 7/1997 | Huppi |
| 5,779,819 | A | 7/1998 | Huppi |
| 5,888,314 | A | 3/1999 | Ushigami et al. |
| 6,361,628 | B1 | 3/2002 | Van Den Brande et al. |
| 2003/0217698 | A1 | 11/2003 | Hiratsuka et al. |
| 2004/0137647 | A1 | 7/2004 | Miyazaki et al. |
| 2005/0112377 | A1 | 5/2005 | Schuhmacher et al. |
| 2013/0273251 | A1 | 10/2013 | Takahashi et al. |
| 2014/0326182 | A1 | 11/2014 | Wang et al. |
| 2015/0361544 | A1 | 12/2015 | Matsuda et al. |
| 2017/0121785 | A1* | 5/2017 | Shingaki ................. C22C 38/06 |

FOREIGN PATENT DOCUMENTS

| | | |
|---|---|---|
| CN | 102650014 A | 8/2012 |
| JP | S4015644 B | 7/1965 |
| JP | S5113469 B2 | 4/1976 |
| JP | H02213460 A | 8/1990 |
| JP | H03122227 A | 5/1991 |
| JP | H046221 A | 1/1992 |
| JP | H04131376 A | 5/1992 |
| JP | H04136154 A | 5/1992 |
| JP | H04198468 A | 7/1992 |
| JP | H04235222 A | 8/1992 |
| JP | H08158038 A | 6/1996 |
| JP | H09118964 A | 5/1997 |
| JP | 2771634 B2 | 7/1998 |

(Continued)

OTHER PUBLICATIONS

Aug. 29, 2017, Office Action issued by the Korean Intellectual Property Office in the corresponding Korean Patent Application No. 10-2017-7022291 with English language Concise Statement of Relevance.

Jan. 19, 2016, Office Action issued by the Korean Intellectual Property Office in the corresponding Korean Patent Application No. 10-2015-7021976 with English language statement of relevance.

Jan. 29, 2016, Extended European Search Report issued by the European Patent Office in the corresponding European Patent Application No. 14752079.5.

Jul. 25, 2016, Office Action issued by the Korean Intellectual Property Office in the corresponding Korean Patent Application No. 10-2015-7021976 with English language statement of relevance.

May 20, 2014 International Search Report issued in International Patent Application No. PCT/JP2014/000815.

Nov. 8, 2016, Office Action issued by the Korean Intellectual Property Office in the corresponding Korean Patent Application No. 10-2015-7021976, with English language concise statement of relevance.

(Continued)

*Primary Examiner* — Jessee R Roe

(74) *Attorney, Agent, or Firm* — Kenja IP Law PC

(57) ABSTRACT

Provided is a method for nitriding a grain-oriented electrical steel sheet which is very useful in obtaining excellent magnetic properties with no variation, that enables generating glow discharge between positive electrodes and negative electrodes disposed in a nitriding zone and irradiating the generated plasma to a strip to perform appropriate nitriding.

7 Claims, 1 Drawing Sheet

(56) References Cited

FOREIGN PATENT DOCUMENTS

| | | |
|---|---|---|
| JP | H1121627 A | 1/1999 |
| JP | 3940205 B2 | 7/2007 |
| JP | 4321120 B2 | 8/2009 |

OTHER PUBLICATIONS

Sep. 1, 2015, Office Action issued by the Japan Patent Office in the corresponding Japanese Patent Application No. 2013-029356.
Sep. 30, 2016, Office Action issued by the State Intellectual Property Office in the corresponding Chinese Patent Application No. 201480009156.4, with English language Search Report.

* cited by examiner

METHOD FOR NITRIDING GRAIN-ORIENTED ELECTRICAL STEEL SHEET

CROSS-REFERENCE TO RELATED APPLICATION

This application is a divisional application of U.S. application Ser. No. 14/761,419, now abandoned, filed Jul. 16, 2015, which is a National Stage Application of PCT/JP2014/000815 filed Feb. 18, 2014, which claims priority based on Japanese Patent Application No. 2013-029356 filed Feb. 18, 2013. The disclosures of the prior applications are hereby incorporated by reference herein in their entirety.

TECHNICAL FIELD

The disclosure relates to an apparatus and a method that are suitable for nitriding a grain-oriented electrical steel sheet.

BACKGROUND

A grain oriented electrical steel sheet is a soft magnetic material used as an iron core material of transformers and generators, and is required to have excellent magnetic properties, in particular low iron loss. This steel sheet has a texture in which the <001> direction, which is an easy magnetization axis of iron, is highly accorded with the rolling direction of the steel sheet. Such texture is formed through the so-called secondary recrystallization where crystal grains with (110)[001] orientation referred to as Goss orientation are preferentially grown massively, during secondary recrystallization annealing in the production process of the grain-oriented electrical steel sheet.

Conventionally, such grain-oriented electrical steel sheets have been manufactured by heating a slab containing 4.5 mass % or less of Si and inhibitor components such as MnS, MnSe and AlN to 1300° C. or higher, thereby dissolving the inhibitor components, then subjecting the slab to hot rolling to obtain a hot rolled steel sheet, and then subjecting the hot rolled steel sheet to hot band annealing as necessary, and subsequent cold rolling once, or twice or more with intermediate annealing performed therebetween until reaching final sheet thickness, then subjecting the steel sheet to primary recrystallization annealing in wet hydrogen atmosphere to perform primary recrystallization and decarburization, and then applying thereon an annealing separator mainly composed of magnesia (MgO) and performing final annealing at 1200° C. for around 5 hours for secondary recrystallization and purification of inhibitor components (e.g. see U.S. Pat. No. 1,965,559A (PTL 1), JPS4015644B (PTL 2) and JPS5113469B (PTL 3)).

However, high temperature heating of a slab not only causes an increase in apparatus costs to achieve heating, but also increases the amount of scale generated during hot rolling and decreases production yield, and further, it causes problems including complicated maintenance of facilities, and therefore, recent demands for reduction in production costs could not be met.

For this reason, various developments have been made for a technique of causing secondary recrystallization without containing inhibitor components in the slab. For example, a technique capable of stably causing secondary recrystallization without containing inhibitor components in the slab, by increasing S content in the steel matrix after primary recrystallization annealing and before completion of secondary recrystallization (sulfur increasing method) has been proposed (JP4321120B (PTL 4)).

Further, a technique that enables strengthening inhibitors after primary recrystallization annealing and before completion of secondary recrystallization and stably causing secondary recrystallization without containing inhibitor components in the slab, by performing gas nitriding before or after decarburization annealing (JP2771634B (PTL 5)), as well as a technique of disposing a reducing zone in front of a nitriding zone to provide a reducing effect to the oxide layer of the steel sheet surface (JPH03122227A (PTL 6)) have been proposed.

Further, in order to perform uniform nitriding over the whole strip during such gas nitriding process, a method of dividing and adjusting the nitriding gas supplied by a nozzle or a spray at the center part of the steel sheet and both ends of the steel sheet, has been proposed (JP3940205B (PTL 7)).

CITATION LIST

Patent Literature

PTL 1: U.S. Pat. No. 1,965,559A
PTL 2: JPS4015644B
PTL 3: JPS5113469B
PTL 4: JP4321120B
PTL 5: JP2771634B
PTL 6: JPH03122227A
PTL 7: JP3940205B

SUMMARY

However, with the technique disclosed in PTL 4, there were cases where the non-uniformity in the temperature and atmosphere during coil heating caused variation in the increase amount of sulfur in the coil and differences in secondary recrystallization behavior, which lead to variation of magnetic properties.

Further, the techniques disclosed in PTLs 5 to 7 are methods of performing nitriding by spraying nitriding gas on the steel sheet. Therefore, non-uniformity of the furnace temperature in terms of duration and position, and difference in decomposition amount of nitriding gas in pipes caused by heat could cause a difference in nitrogen increase depending on the area of the strip, and as a result, secondary recrystallization could become non-uniform and lead to deterioration of magnetic properties.

It could therefore be helpful to provide an apparatus for nitriding a grain-oriented electrical steel sheet which is very useful in obtaining excellent magnetic properties with no variation without containing inhibitor components in the slab when producing a grain-oriented electrical steel sheet, by performing appropriate nitriding before secondary recrystallization and uniformly dispersing inhibitor forming elements over the full length and full width of the strip, together with a nitriding method using the nitriding apparatus.

In order to solve the above problems, we have made intensive studies.

As a result, we discovered that, when performing continuous nitriding of a strip (steel sheet), by performing nitriding by utilizing glow discharge, the amount of nitridation can be controlled with high accuracy, the variation of said amount can be eliminated, the time required for treatment can be reduced, and therefore excellent magnetic properties can be obtained stably for the whole strip.

We carried out further investigation for a more practical nitriding by glow discharge.

As a result, we discovered that, instead of using the material to be treated as the negative electrode as in normal plasma nitriding, by disposing negative electrodes near the material to be treated, applying voltage between the negative electrodes and positive electrodes disposed on the outside thereof to generate glow discharge, and passing a strip in a state where plasma is generated by the glow discharge generation to perform nitriding thereon, defects such as arcing caused when voltage is applied directly to the strip and plasma is generated, can effectively be suppressed.

Further, we discovered that the above described plasma nitriding by glow discharge is the optimal structure as an apparatus required for nitriding the strip.

We Thus Provide:

1. An apparatus for nitriding a grain-oriented electrical steel sheet for continuously nitriding a strip continuously being fed after cold rolling and before secondary recrystallization annealing in a production line of a grain-oriented electrical steel sheet, comprising:
a nitriding zone for nitriding the strip;
a cooling zone for cooling the strip; and
an optional heating zone provided upstream of the nitriding zone for heating the strip,
wherein the nitriding zone contains positive electrodes for glow discharge provided opposite to the strip and negative electrodes for glow discharge provided proximate to the strip between the positive electrodes and the strip, and glow discharge is generated between the positive electrodes and the negative electrodes and the generated plasma is applied to the strip to nitride the strip.

2. The apparatus for nitriding a grain-oriented electrical steel sheet according to aspect 1, wherein the nitriding zone is kept under reduced pressure.

3. The apparatus for nitriding a grain-oriented electrical steel sheet according to aspect 2, wherein at least one of the heating zone and the cooling zone is kept at a state with a lower degree of pressure reduction compared to the nitriding zone and reduced pressure compared to atmospheric pressure.

4. The apparatus for nitriding a grain-oriented electrical steel sheet according to any of aspects 1 to 3, further comprising an upstream atmosphere adjusting zone provided between the heating zone and the nitriding zone, and a downstream atmosphere adjusting zone provided between the nitriding zone and the cooling zone.

5. The apparatus for nitriding a grain-oriented electrical steel sheet according to aspect 4, wherein the upstream atmosphere adjusting zone and the downstream atmosphere adjusting zone are each divided into multiple air chambers where the degrees of pressure reduction are individually adjustable.

6. The apparatus for nitriding a grain-oriented electrical steel sheet according to aspect 5, wherein the degrees of pressure reduction of the air chambers in the upstream atmosphere adjusting zone are gradually increased toward the nitriding zone, while the degree of pressure reduction of the air chambers in the downstream atmosphere adjusting zone are gradually decreased toward the cooling zone.

7. The apparatus for nitriding a grain-oriented electrical steel sheet according to any of aspects 1 to 6, wherein the inside of the nitriding zone is divided into multiple zones in the width direction of the strip to allow individual controls of nitriding inside each divided zone.

8. A method for nitriding a grain-oriented electrical steel sheet comprising plasma nitriding the strip by glow discharge using the apparatus according to any of aspects 1 to 7 after cold rolling and before secondary recrystallization annealing during producing a grain-oriented electrical steel sheet.

With this disclosure, it is possible to suppress variation of nitriding and to stably guarantee a uniform amount of nitridation for the whole strip, and therefore it is possible to stably obtain excellent magnetic properties over the full length and full width of the strip.

Further, in this disclosure, instead of using a strip which is the material to be treated, as a negative electrode, negative electrodes are disposed near the material to be treated, and glow discharge is generated between the negative electrodes and the positive electrodes and the plasma generated by the glow discharge generation is applied to the strip to perform nitriding. Therefore, it is possible to effectively suppress generation of defects such as arcing which is caused when the strip is used as a negative electrode.

Further, with this method, nitrogen gas can be used as a nitrogen source, and therefore nitrogen sources which may cause environmental problems such as ammonia required for performing gas nitriding, cyan salt required for performing salt bath nitriding or the like do not have to be used. For these reasons, our method has a significant industrial usefulness.

DETAILED DESCRIPTION

Our methods and components will be described in detail below.

Figure 1:
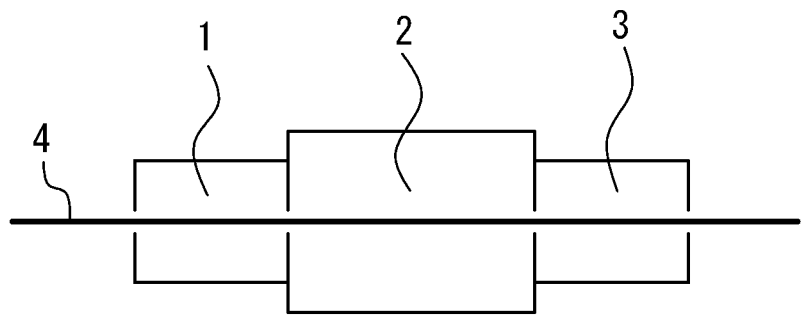
FIG. 1 schematically shows a preferable example of the nitriding apparatus of the disclosure.

FIG. 1 schematically shows a preferable example of the nitriding apparatus of the disclosure. In the figure, a heating zone is labeled 1, a nitriding zone is labeled 2, and a cooling zone is labeled 3. Further, a strip (steel sheet) continuously passing inside the nitriding apparatus with a structure comprising the aforementioned components is labeled 4. The heating zone may be provided when required and is not always necessary.

In the disclosure, a strip 4 is subjected to plasma nitriding by glow discharge in the above nitriding zone 2.

Figure 2:
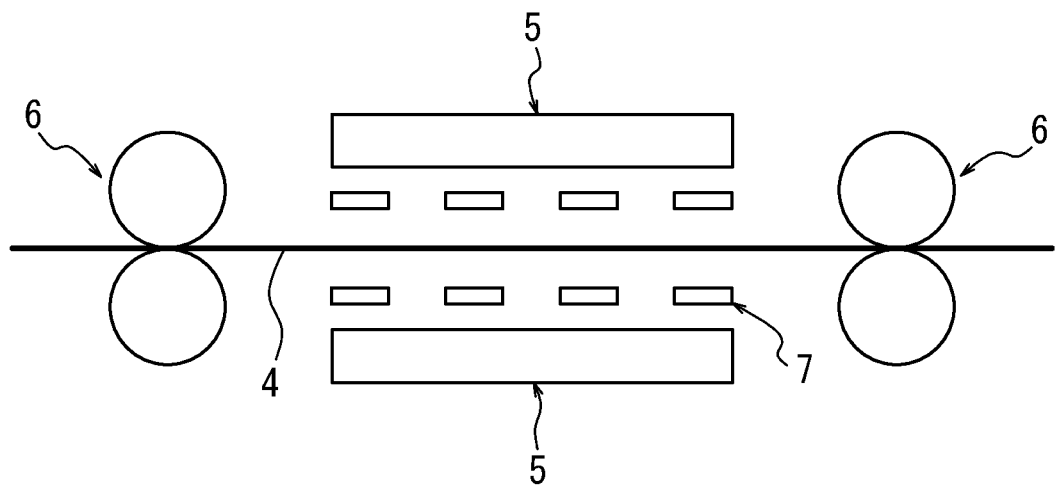
FIG. 2 shows a preferable example of a plasma nitriding device according to the disclosure.

FIG. 2 shows a preferable example of a plasma nitriding device according to the disclosure. In the figure, positive electrodes for glow discharge disposed opposite to the strip 4 are labeled 5, pinch rolls are labeled 6, and negative electrodes disposed near the strip 4 are labeled 7.

The inner part of the nitriding zone 2 is filled with nitrogen gas and hydrogen gas as nitrogen sources.

A voltage is applied between the positive electrodes 5 and the negative electrodes 7 to generate glow discharge, and by irradiating the strip 4 with the plasma generated during glow discharge generation, the surface of the strip 4 is subjected to nitriding.

As described above, in the disclosure, it is necessary for the plasma generated between the positive electrodes and the negative electrodes to pass through the negative electrodes and reach the strip. Therefore, the negative electrodes must be perforated or mesh-like.

When performing the above nitriding, the strip is preferably heated to a temperature of 400° C. or higher.

Further, the inside of the nitriding zone is preferably kept under a reduced pressure.

Further, although the heating zone and the cooling zone have a lower degree of pressure reduction compared to the nitriding zone, it is preferable for them to be kept in a state with reduced pressure compared to atmospheric pressure, and by doing so, heat exchange due to convection tends to proceed, and heating and cooling efficiency can be improved.

The inside of the nitriding zone is preferably depressurized to around 0.5 torr to 10 torr which is a preferable glow discharge condition, and the heating zone and the cooling zone are preferably depressurized, with a lower degree of pressure reduction, to around 30 torr to 500 torr.

Figure 3:
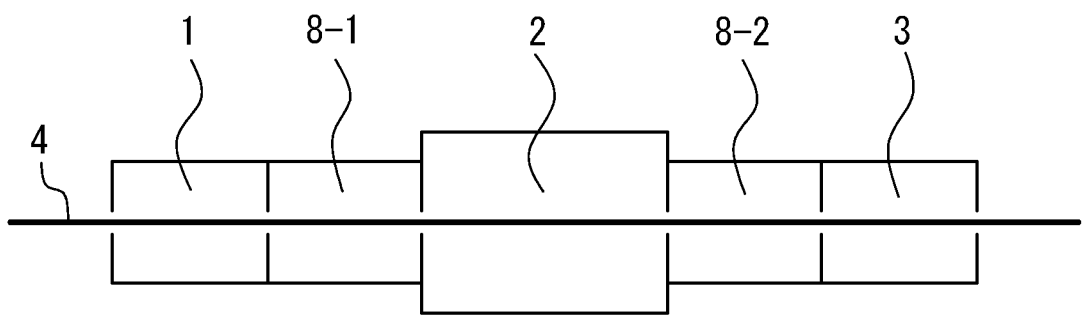
FIG. 3 schematically shows another example of the nitriding apparatus of the disclosure.

Next, FIG. 3 shows an upstream atmosphere adjusting zone 8-1 and a downstream atmosphere adjusting zone 8-2 with a nitriding zone 2 in between.

In this case, each of the upstream atmosphere adjusting zone 8-1 and the downstream atmosphere adjusting zone 8-2 is preferably divided into multiple air chambers where the degrees of pressure reduction are individually adjustable. In a preferable construction, the degrees of pressure reduction of the air chambers in the upstream atmosphere adjusting zone 8-1 are gradually increased toward the nitriding zone 2, while the degree of pressure reduction of the air chambers in the downstream atmosphere adjusting zone 8-2 are gradually decreased from the nitriding zone 2 toward the cooling zone 3.

As the seal between each zone and each air chamber, conventionally known airtight seals may be used, such as rolls, seal pads and the like.

In a preferable structure, the inside of the nitriding zone is divided into multiple zones in the width direction of the strip where nitriding can be performed individually inside each divided zone. By adopting such structure, it is possible to effectively eliminate non-uniformity in nitridation in the width direction of the strip, such as excessive nitriding of the edges due to edge effects.

The heating zone can be omitted if it is disposed in a continuous line for performing other necessary treatment and the strip is already heated, or if the heating by plasma irradiation at the time of plasma nitriding is sufficient.

Further, in a case where another treatment is performed after plasma nitriding with the strip at a heated state, the cooling zone may be disposed after the zone for such treatment.

Further, the nitriding apparatus disclosed herein may be an independent apparatus that continuously performs only nitriding, or be attached to a processing line for performing another treatment, and in the case of a continuous line, it may be attached to the optimal place considering conditions including efficiency.

In the disclosure, the strip which is the material to be treated is not particularly limited and, as long as it is a grain-oriented electrical steel strip, any conventionally known strip is applicable.

REFERENCE SIGNS LIST

1 Heating Zone
2 Nitriding Zone
3 Cooling Zone
4 Strip (Steel Sheet)
5 Positive Electrode
6 Pinch Roll
7 Negative Electrode
8-1 Upstream Atmosphere Adjusting Zone
8-2 Downstream Atmosphere Adjusting Zone

The invention claimed is:

1. A method for nitriding a grain-oriented electrical steel sheet comprising plasma nitriding a strip by glow discharge using an apparatus after cold rolling and before secondary recrystallization annealing during producing a grain-oriented electrical steel sheet, the apparatus comprising:
   a nitriding zone for nitriding the strip;
   a cooling zone for cooling the strip; and
   an optional heating zone provided upstream of the nitriding zone for heating the strip,
   wherein the nitriding zone contains positive electrodes for glow discharge provided opposite to the strip and negative electrodes for glow discharge provided proximate to the strip between the positive electrodes and the strip, and glow discharge is generated between the positive electrodes and the negative electrodes and the generated plasma is applied to the strip to nitride the strip.

2. The method according to claim 1, wherein the nitriding zone is kept under reduced pressure.

3. The method according to claim 2, wherein at least one of the heating zone and the cooling zone is kept at a state with a lower degree of pressure reduction compared to the nitriding zone and reduced pressure compared to atmospheric pressure.

4. The method according to claim 1, further comprising an upstream atmosphere adjusting zone provided between the heating zone and the nitriding zone, and a downstream atmosphere adjusting zone provided between the nitriding zone and the cooling zone.

5. The method according to claim 4, wherein the upstream atmosphere adjusting zone and the downstream atmosphere adjusting zone are each divided into multiple air chambers where the degrees of pressure reduction are individually adjustable.

6. The method according to claim 5, wherein the degrees of pressure reduction of the air chambers in the upstream atmosphere adjusting zone are gradually increased toward the nitriding zone, while the degree of pressure reduction of the air chambers in the downstream atmosphere adjusting zone are gradually decreased toward the cooling zone.

7. The method according to claim 1, wherein the inside of the nitriding zone is divided into multiple zones in the width direction of the strip to allow individual controls of nitriding inside each divided zone.

* * * * *